United States Patent [19]

Roberts

[11] Patent Number: 5,118,641
[45] Date of Patent: Jun. 2, 1992

[54] METHODS FOR REDUCING ENCROACHMENT OF THE FIELD OXIDE INTO THE ACTIVE AREA ON A SILICON INTEGRATED CIRCUIT

[75] Inventor: Martin C. Roberts, Boise, Id.

[73] Assignee: Micron Technology, Inc., Boise, Id.

[21] Appl. No.: 581,669

[22] Filed: Sep. 13, 1990

[51] Int. Cl.$^5$ ............................................. H01L 21/76
[52] U.S. Cl. ........................................ 437/69; 437/73
[58] Field of Search ................................ 437/69, 73

[56] References Cited

U.S. PATENT DOCUMENTS

| | | | |
|---|---|---|---|
| 4,839,301 | 6/1989 | Lee | 437/29 |
| 4,871,688 | 10/1989 | Lowrey | 437/47 |

FOREIGN PATENT DOCUMENTS

| | | | |
|---|---|---|---|
| 58-168264 | 10/1983 | Japan | 437/69 |
| 59-72770 | 4/1984 | Japan | 437/69 |
| 114926 | 1/1989 | Japan | 437/69 |
| 1437112 | 5/1976 | United Kingdom | 437/69 |

OTHER PUBLICATIONS

Wu, T. C., et al., "The Influence of LOCOS Processing Parameters on the Shape of the Bird's Beak Structure", Journal of Electrochem. Soc.: Solid State Science and Technology, Jul. 1983, pp. 1563-1566.
Ghandi, S. K., "*VCSI Fabrication Principles*" *Silicon and Gallium Arsenide* ©1983, p. 524.
Noel, J. P. et al., "Characteristics of dc Magnetron Reactively Sputtered TiN$_x$ Films for Diffusion Barriers in III-V Semiconductor Metallization,"(1983).
Wittmer, M. et al., "Applications of TiN Thin Films in Silicon Device Technology".
Wittmer, M., "Properties and Microelectronic Applications of Thim Films of Refractory Metal Nitrides", J. Vac. Sci. Tech. A, vol. 3, No. 4 (1985).

*Primary Examiner*—Olik Chaudhuri
*Assistant Examiner*—G. Fourson
*Attorney, Agent, or Firm*—Workman, Nydegger & Jensen

[57] ABSTRACT

Methods for reducing encroachment of the field oxide into the active area on a silicon integrated circuit are disclosed. The present invention modifies the conventional LOCOS technique for forming active areas and field oxide areas on a silicon substrate. Rather than fully forming the field oxide regions immediately after the silicon nitride layer is patterned and etched on the substrate, a thin field oxide is grown. This oxide is partially wet etched to leave a ribbon of bare silicon around and extending under the edges of the silicon nitride mask. An additional nitride layer is deposited over the entire wafer and anisotropically etched to form a nitride spacer between the original nitride mask and the partially grown field oxide. The nitride spacer seals the edge of the active area by inhibiting the diffusion of oxygen under the nitride mask. During subsequent field oxidation, the nitride spacer greatly reduces the encroachment of the field oxide into the active area.

11 Claims, 3 Drawing Sheets

METHODS FOR REDUCING ENCROACHMENT OF THE FIELD OXIDE INTO THE ACTIVE AREA ON A SILICON INTEGRATED CIRCUIT

BACKGROUND

1. The Field of the Invention

The present invention relates to the manufacture of semiconductor circuit devices. More particularly, the present invention is directed to methods for reducing encroachment of the field oxide into the active area on a silicon integrated circuit.

2. Technology Review

The conventional LOCOS (local oxidation of silicon) technique is often used to define active regions and isolation or field oxide regions of a silicon wafer. In the LOCOS process, a silicon substrate or wafer is oxidized to form a thin gate oxide layer comprising $SiO_2$. A silicon nitride pattern is formed on the gate oxide layer and the silicon substrate is further oxidized. The nitride layer inhibits diffusion of oxygen whereas the gate oxide allows oxygen diffusion. As a result, the silicon substrate which is not protected by the nitride layer is oxidized to form field oxide regions. As used herein, the term "oxide" refers to silicon dioxide ($SiO_2$).

A significant problem with this technique for forming field oxide regions and active regions is that the field oxide encroaches under the nitride layer into the active region, thereby reducing the area of the active region. The encroachment represents wasted space on the final semiconductor circuit device. Any technique which is able to reduce the amount of wasted space on the semiconductor circuit without compromising performance would open the possibility for even further miniaturization of the semiconductor circuit device.

Attempts have been made in the art for reducing encroachment of the field oxide into the active region. One process, known as the SWAMI technique, addresses the problem of encroachment of the field oxide. In the SWAMI technique, a silicon nitride pattern is deposited on the gate oxide layer as in the conventional LOCOS technique, but rather than oxidize the silicon substrate, the gate oxide and silicon substrate are etched. Thereafter, a second gate oxide layer is formed where the substrate had been etched and a nitride layer and an oxide layer are deposited over the entire substrate. The outer nitride and oxide layers are subsequently anisotropically etched, and the substrate is oxidized to form the field oxide regions.

Although the SWAMI technique is effective at reducing the encroachment of the field oxide, it tends to damage the underlying silicon substrate. Hence, processes for producing semiconductor circuit devices using the SWAMI technique have low yields. Moreover, because the SWAMI technique can require as many as six or seven additional processing steps, it is not widely used in the industry.

From the foregoing, it will be appreciated that what is needed in the art are methods for reducing encroachment of the field oxide into the active area on a silicon integrated circuit.

Additionally, it would be a significant advancement in the art to provide methods for reducing the encroachment of the field oxide into the active area which do not add a significant number of additional processing steps.

Finally, it would be an important advancement in the art to provide methods for reducing the encroachment of the field oxide into the active area on a silicon integrated circuit which does not damage the silicon substrate.

Such methods for reducing encroachment of the field oxide into the active area on a silicon integrated circuit are disclosed and claimed herein.

BRIEF SUMMARY AND OBJECTS OF THE INVENTION

The present invention is directed to methods for reducing encroachment of the field oxide into the active area on a silicon integrated circuit. The currently preferred process within the scope of the present invention represents a modification of the conventional LOCOS technique for forming active areas and field oxide areas on a silicon substrate.

According to the presently preferred process, a silicon nitride layer is patterned and etched on the substrate according to conventional techniques. Instead of growing the field oxide to its full thickness, a thin field oxide is grown. This oxide is partially wet etched, according to standard industry techniques, to leave a ribbon of bare silicon around the nitride mask.

An additional nitride layer is deposited over the entire wafer. The nitride layer is then anisotropically etched to a depth sufficient to remove the nitride layer from the thin field oxide and to leave a nitride spacer between the original nitride mask and the partially grown field oxide. The nitride spacer seals the edge of the active area by inhibiting the diffusion of oxygen under the nitride mask. During subsequent field oxidation, the nitride spacer greatly reduces the encroachment of the field oxide into the active area.

Experimental results demonstrate that the foregoing process achieves a large reduction in field oxide encroachment with the addition of only four processing steps to the conventional LOCOS technique. In addition, it has been found that the yield of semiconductor devices produced using a process within the scope of the present invention is not significantly reduced.

It is, therefore, an object of the present invention to provide methods for reducing encroachment of the field oxide into the active area on a silicon integrated circuit.

Another important object of the present invention is to provide methods for reducing the encroachment of the field oxide into the active area which do not add a significant number of additional processing steps.

Yet another important object of the present invention is to provide methods for reducing the encroachment of the field oxide into the active area on a silicon integrated circuit which does not damage the silicon substrate.

These and other objects and features of the present invention will become more fully apparent from the following description and appended claims, or may be learned by the practice of the invention.

BRIEF DESCRIPTION OF THE DRAWINGS

In order to more fully understand the manner in which the above-recited and other advantages and objects of the invention are obtained, a more particular description of the invention briefly described above will be rendered by reference to a specific embodiment thereof which is illustrated in the appended drawings. Understanding that these drawings depict only a typical embodiment of the invention and are not therefore to be considered limiting in its scope, the invention and the presently understood best mode thereof will be described and explained with additional specificity and detail through the use of the accompanying drawings in which.

DETAILED DESCRIPTION OF THE PREFERRED EMBODIMENTS

The present invention provides methods for reducing encroachment of the field oxide into the active area on silicon integrated circuits. An important step in the overall process of manufacturing integrated circuits is defining active and isolation areas on the silicon wafer substrate. The isolation areas are typically a relatively thick layer of silicon dioxide, commonly referred to as the "field oxide." Reference will be made to the figures wherein like parts will be designated with like numerals throughout.

Figure 1:
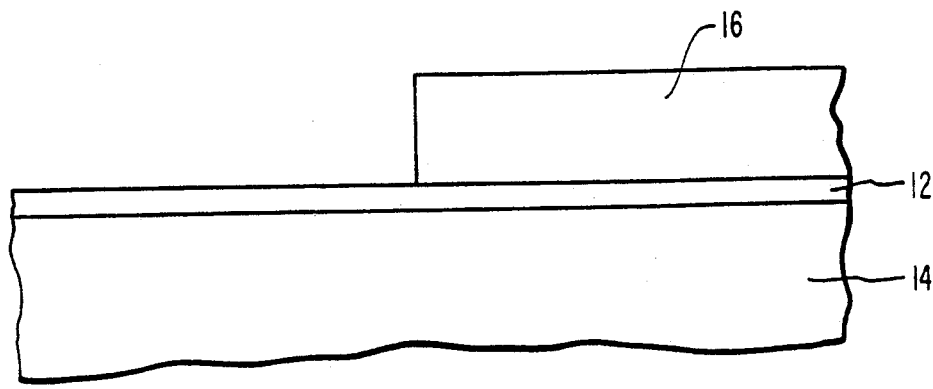
FIG. 1 is a cross-sectional view of a typical silicon nitride mask over a gate oxide layer formed on a silicon substrate.

As shown in FIG. 1, a thin gate oxide layer 12 is formed on the silicon wafer substrate 14 over which a silicon nitride mask 16 is formed. Gate oxide layer 12 is typically between 200 Å and 250 Å thick. The silicon nitride mask 16 defines those areas which are to remain active. Because silicon nitride inhibits oxygen diffusion, the silicon nitride mask protects the active areas on the silicon substrate from oxidation. When the silicon wafer substrate is heated in an oxygen-containing atmosphere, oxygen diffuses through the gate oxide into the unmasked silicon substrate and oxidizes the silicon to form $SiO_2$. The silicon nitride mask 16 may be prepared according to standard industry techniques.

Figure 2:
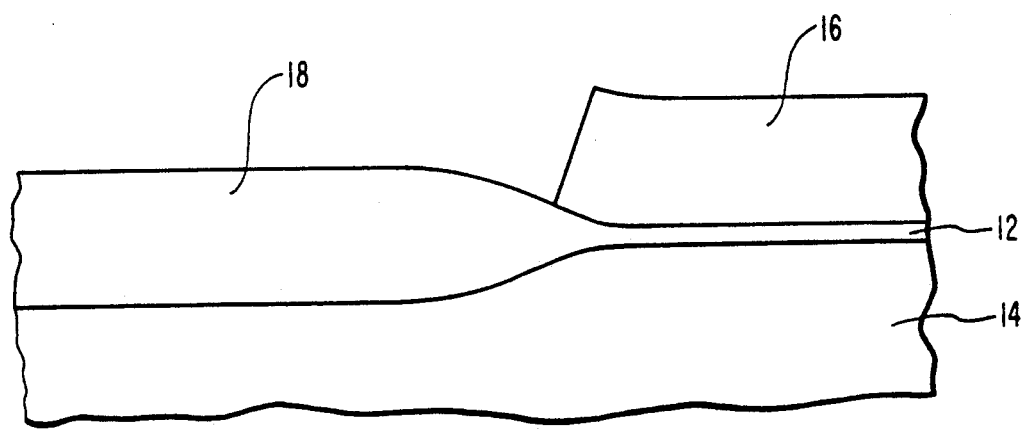
FIG. 2 is a cross-sectional view of the device shown in FIG. 1 after partial field oxidation.

In conventional LOCOS techniques, the full thickness field oxide would be formed after the silicon wafer substrate is properly masked. The currently preferred process departs from the known LOCOS techniques by growing a thin field oxide 18, shown in FIG. 2, instead of growing the field oxide to its full thickness. The thin field oxide preferably has a thickness in the range from about 1500 Å to about 3000 Å.

Figure 3:
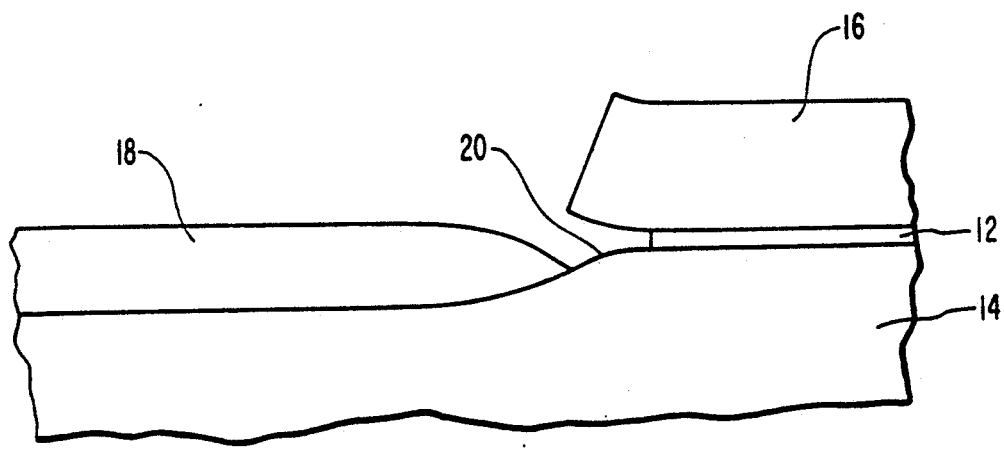
FIG. 3 is a cross-sectional view of the device shown in FIG. 2 following a wet etch of the partial field oxide.

The silicon wafer substrate is then partially wet etched, according to standard industry techniques, to remove some of the exposed silicon dioxide. The etching solution preferably selectively removes silicon dioxide instead of silicon nitride. The concentration of the etching solution and its exposure time with the silicon wafer substrate are balanced such that a sufficient amount of the thin field oxide 18 is removed to form a ribbon of bare silicon 20 around the silicon nitride mask 16. This is shown best in FIG. 3.

A hydrofluoric acid solution is one currently preferred composition for etching the silicon wafer substrate. Various concentrations of hydrofluoric acid may be used, as for example concentrations in the range from about 5 percent to 20 percent by weight. Those skilled in the art will appreciate that concentrated hydrofluoric acid solutions will require less time to etch the substrate than dilute hydrofluoric acid solutions. The actual time required to etch the silicon substrate for a given hydrofluoric acid concentration can be calculated using known techniques in the semiconductor manufacturing industry. Once the ribbon of bare silicon 20 is formed, a thin layer of native silicon dioxide (not shown in FIG. 3) forms over the bare silicon. The native silicon dioxide is usually between about 20 Å to 40 Å thick.

Figure 4:
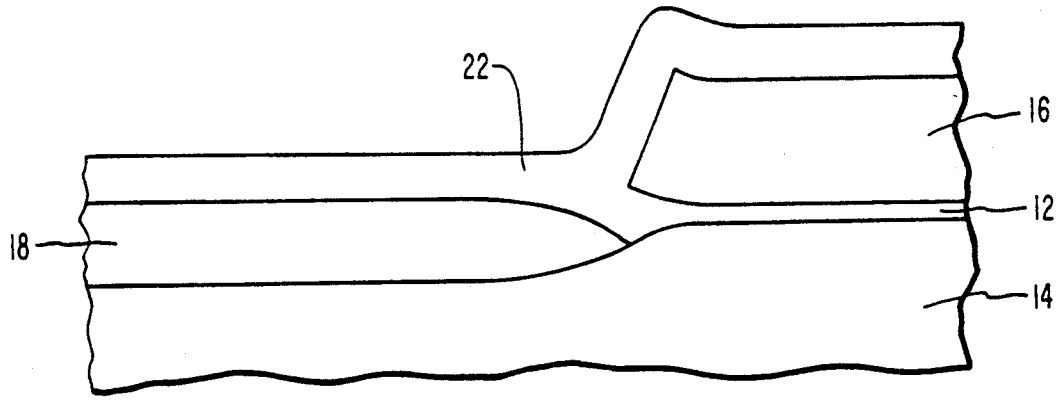
FIG. 4 is a cross-sectional view of the device shown in FIG. 3 showing a layer of silicon nitride deposited over the device.

A silicon nitride layer 22, illustrated in FIG. 4, is then deposited over the entire wafer according to conventional techniques known in the art. One currently preferred technique for depositing the silicon nitride layer 22 is by low pressure chemical vapor deposition. The silicon nitride layer 22 is preferably in the range from about 700 Å to about 1200 Å thick.

Figure 5:
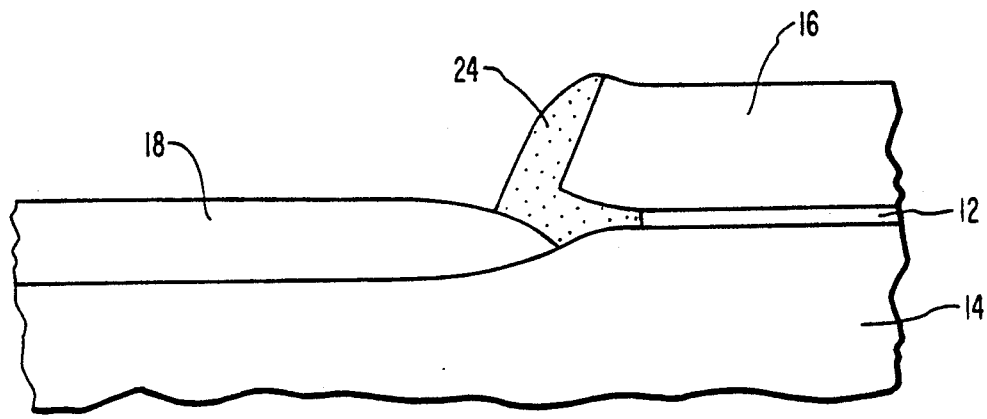
FIG. 5 is a cross-sectional view of the device shown in FIG. 4 after the outer silicon nitride layer is anisotropically etched.

Referring to FIG. 5, the silicon nitride layer 22 is then anisotropically etched to a depth sufficient to remove the silicon nitride layer from the thin field oxide 18 and to leave a silicon nitride spacer 24 between the silicon nitride mask 16 and the partially grown field oxide 18. The silicon nitride spacer 24 seals the edge of the active area by inhibiting oxygen diffusion under the silicon nitride mask 16.

Figure 6:
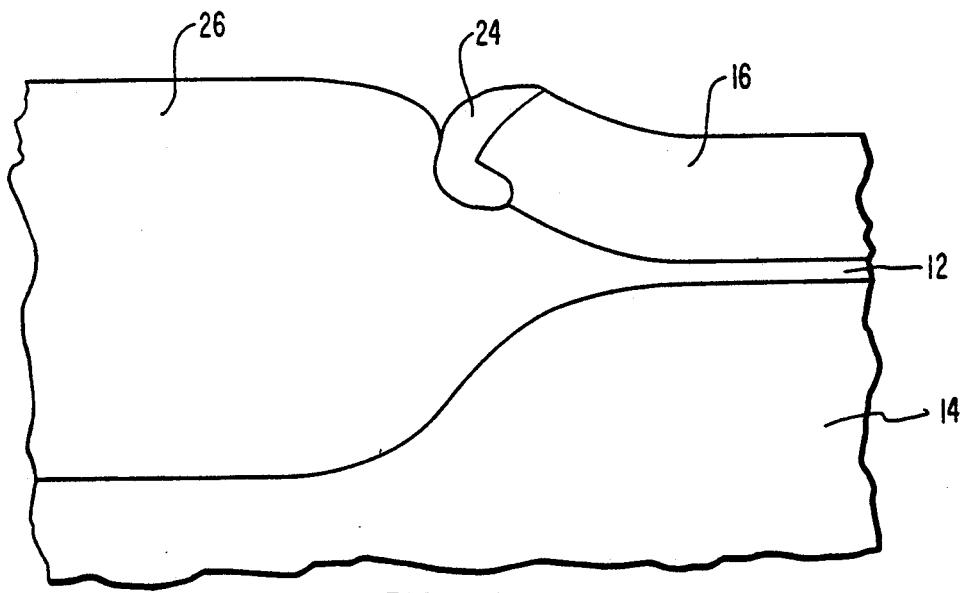
FIG. 6 is a cross-sectional view of the device shown in FIG. 5 after complete field oxidation.

FIG. 6 shows the formation of the field oxide 26 at its complete thickness. Field oxidation may be achieved according to conventional industry techniques, such as heating the silicon wafer substrate in an atmosphere containing oxygen. During field oxidation, the silicon nitride spacer 24 greatly reduces the encroachment of the field oxide 26 into the active area under the silicon nitride mask 16. In 1 micron and 0.8 micron geometry circuits, the typical field oxide thickness needed for isolation is in the range from about 6000 Å to about 7000 Å.

Various methods for reducing encroachment of the field oxide into the active area on a silicon integrated circuit within the scope of the present invention will be further clarified by a consideration of the following examples, which are intended to be purely exemplary of the use of the invention and should not be viewed as a limitation on any claimed embodiment.

EXAMPLE 1

This example presents one method within the scope of the present invention for reducing encroachment of the field oxide into the active area on a silicon integrated circuit. An initial gate oxide layer was prepared on a silicon wafer substrate according to conventional industry techniques. Portions of the gate oxide layer were then masked with silicon nitride to define active regions on the substrate. The silicon substrate was oxidized according to standard techniques to form thin field oxide regions on the unmasked portions of the substrate. The thin field oxide was grown to a thickness of about 2000 Å.

The silicon wafer substrate was then etched in a 10% hydrofluoric acid solution for about 3 minutes in order to remove a sufficient amount of the field oxide region to form a ribbon of bare silicon around the silicon nitride mask, between the mask and the field oxide. A layer of silicon nitride having a thickness of about 1000 Å was then deposited on the silicon wafer substrate. The silicon nitride was deposited using low pressure chemical vapor deposition according to conventional techniques known in the art.

The silicon nitride layer was anisotropically etched in order to remove the silicon nitride from the field oxide. A silicon nitride spacer remained in the region between the mask and the field oxide. Finally, the silicon wafer substrate was oxidized according to standard techniques to form full-thickness field oxide regions on the unmasked portions of the substrate. The field oxide was grown to a thickness of about 6500 Å.

Figure 7:
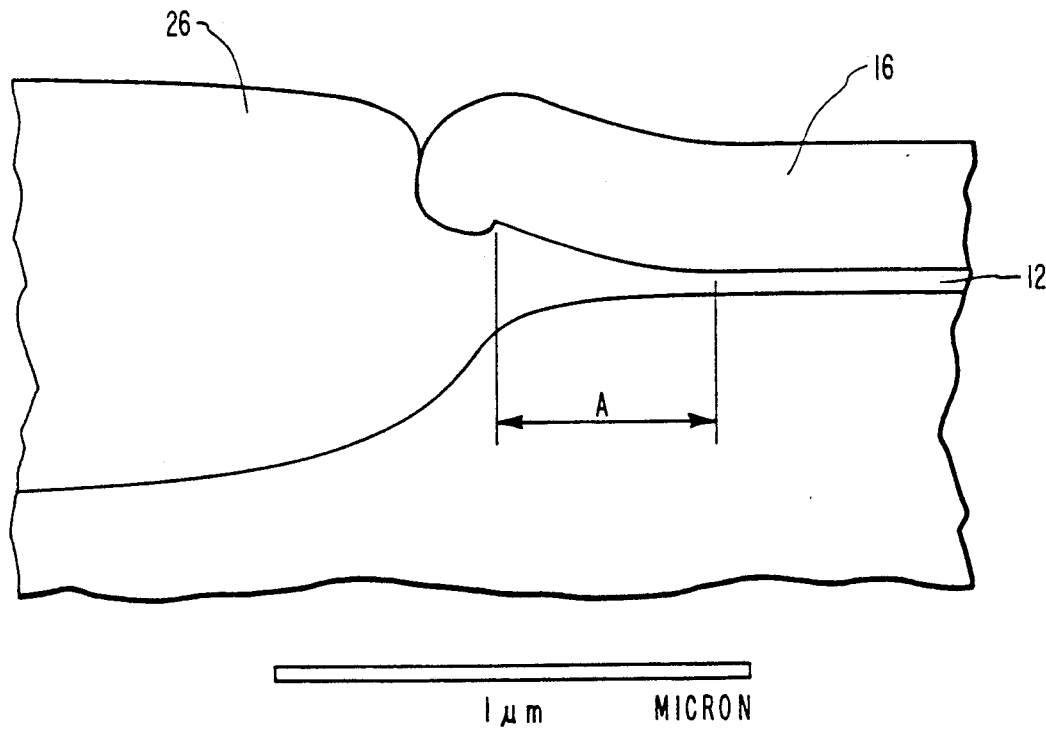
FIG. 7 is a cross-sectional view, drawn to scale, which illustrates the field oxide encroachment into the active area using a process according to the teachings of the present invention.
Figure 8:
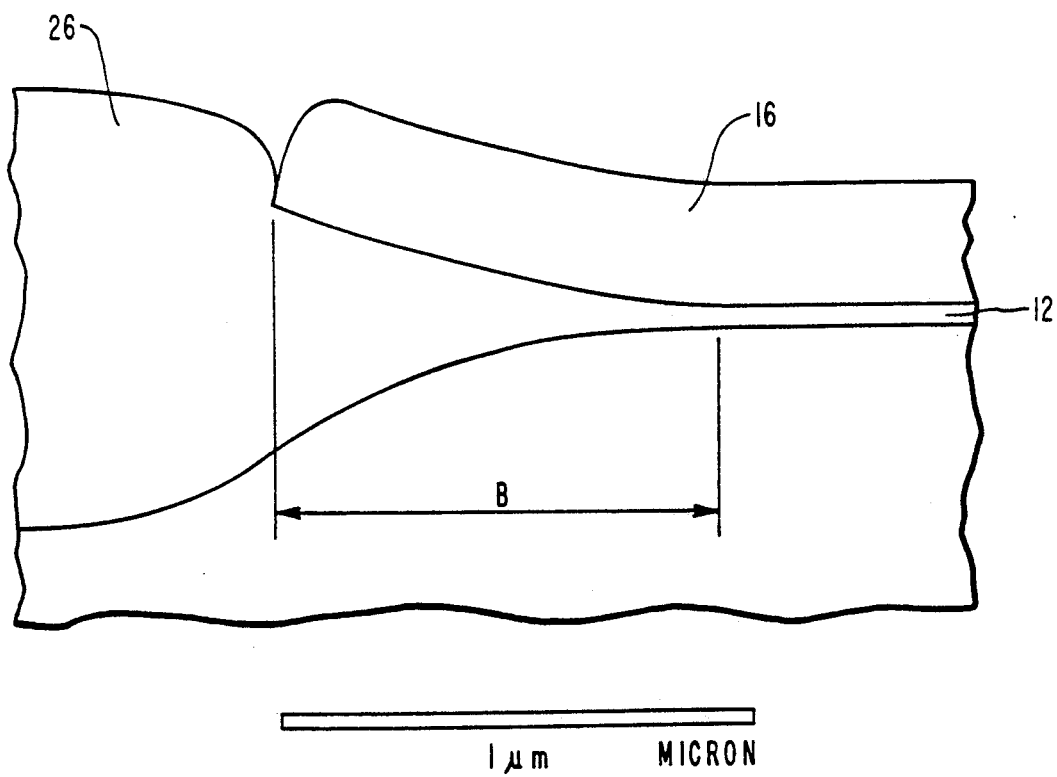
FIG. 8 is a cross-sectional view, drawn to scale, which illustrates the typical encroachment of field oxide into the active area of a semiconductor device using the standard LOCOS process.

Photomicrographs were taken of the cross-sectional configuration of a silicon wafer substrate after field oxidation according to the procedure of Example 1 and according to conventional LOCOS techniques. FIGS. 7 and 8 are pictorial representations of the actual photomicrographs. The distance "A" of FIG. 7 represents the amount of encroachment of the field oxide into the active area following the procedure of Example 1. The distance "B" of FIG. 8 represents the amount of encroachment following a conventional LOCOS field oxidation. Comparing distances A and B, it is apparent that the amount of encroachment of the field oxide into the active region using the process of Example 1 is significantly less than the encroachment using conventional processes.

In addition, it has been found that the yield of semiconductor devices produced using the process of Example 1 showed a slight 3% reduction in yield compared to control wafers using conventional techniques. It is believed that this reduction in yield can be eliminated once the process is optimized and standardized.

EXAMPLE 2

Field oxide encroachment into the active area of a silicon integrated circuit is reduced according to the procedure of Example 1, except that the thin field oxide is grown to a thickness of about 1500 Å, rather than 2000 Å, and the length of time the silicon wafer substrate is etched in a the hydrofluoric acid solution is reduced to about 2 minutes, instead of 3 minutes.

EXAMPLE 3

Field oxide encroachment into the active area of a silicon integrated circuit is reduced according to the procedure of Example 1, except that the thin field oxide is grown to a thickness of about 3000 Å, rather than 2000 Å, and the length of time the silicon wafer substrate is etched in a the hydrofluoric acid solution is increased to about 4 minutes, instead of 3 minutes.

EXAMPLE 4

Field oxide encroachment into the active area of a silicon integrated circuit is reduced according to the procedure of Example 1, except that the layer of silicon nitride is deposited on the silicon wafer substrate to a thickness of about 700 Å.

EXAMPLE 5

Field oxide encroachment into the active area of a silicon integrated circuit is reduced according to the procedure of Example 1, except that the layer of silicon nitride is deposited on the silicon wafer substrate to a thickness of about 1200 Å.

EXAMPLE 6

Field oxide encroachment into the active area of a silicon integrated circuit is reduced according to the procedure of Example 1, except that the silicon wafer substrate is oxidized to form full-thickness field oxide regions on the unmasked portions of the substrate having a thickness of about 7000 Å.

EXAMPLE 7

Field oxide encroachment into the active area of a silicon integrated circuit is reduced according to the procedure of Example 1, except that the silicon wafer substrate is oxidized to form full-thickness field oxide regions on the unmasked portions of the substrate having a thickness of about 6000 Å.

From the foregoing, it will be appreciated that the present invention provides methods for reducing encroachment of the field oxide into the active area on a silicon integrated circuit.

In addition, the present invention provides methods for reducing the encroachment of the field oxide into the active area which do not add a significant number of additional processing steps.

Finally, it will be further appreciated that the present invention provides methods for reducing the encroachment of the field oxide into the active area on a silicon integrated circuit which does not damage the silicon substrate or significantly reduce yield.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for reducing encroachment of field oxide into the active area of a semiconductor device during local oxidation of silicon techniques, the method comprising the steps of:
   (a) preparing an initial gate oxide layer on a silicon substrate;
   (b) masking portions of the gate oxide layer to define active regions on the substrate and leaving other portions of the gate oxide layer unmasked;
   (c) partially oxidizing the silicon substrate on the unmasked portions of the gate oxide to form field oxide regions on the substrate having a partial final thickness;
   (d) isotropically removing a portion of the field oxide and gate oxide regions such that a ribbon of bare silicon is exposed and extends generally horizontally under an edge of the mask and between the field oxide and gate oxide;
   (e) depositing a layer of silicon nitride over the exposed portion of said substrate and the field oxide and mask situated thereon;
   (f) anisotropically etching the layer of silicon nitride such that the silicon nitride is removed from the field oxide and such that a silicon nitride spacer is retained in the region previously occupied by said exposed, bare silicon; and
   (g) oxidizing the silicon substrate on the partially formed field oxide regions to form field oxide regions on the substrate having a final thickness.

2. A method for reducing encroachment of field oxide into the active area of a semiconductor device as defined in claim 1, wherein the mask includes silicon nitride.

3. A method for reducing encroachment of field oxide into the active area of a semiconductor device as defined in claim 1, wherein the silicon substrate under the unmasked portions of the gate oxide is partially oxidized to form field oxide regions on the substrate having the partial final thickness in the range from about 1500 Å to about 3000 Å.

4. A method for reducing encroachment of field oxide into the active area of a semiconductor device as defined in claim 1, wherein the portion of field oxide region is removed by etching the field oxide with a hydrofluoric acid solution.

5. A method for reducing encroachment of field oxide into the active area of a semiconductor device as defined in claim 4, wherein the hydrofluoric acid solution has a concentration in the range from about 5% HF to about 20% HF by weight.

6. A method for reducing encroachment of field oxide into the active area of a semiconductor device as defined in claim 4, wherein the layer of silicon nitride is deposited by the process of low pressure chemical vapor deposition.

7. A method for reducing encroachment of field oxide into the active area of a semiconductor device as defined in claim 4, wherein the layer of silicon nitride is deposited to a thickness in the range from about 700 Å to about 1200 Å.

8. A method for reducing encroachment of field oxide into the active area of a semiconductor device as defined in claim 1, wherein the silicon substrate under the partially oxidized field oxide regions is further oxidized to form field oxide regions on the substrate having the final thickness in the range from about 6000 Å to about 7000 Å.

9. A method for reducing encroachment of field oxide into the active area of a semiconductor device during local oxidation of silicon techniques, the method comprising the steps of:
    (a) preparing an initial gate oxide layer on a silicon substrate;
    (b) masking portions of the gate oxide layer with a silicon nitride mask to define active regions on the substrate and leaving other portions of the gate oxide layer unmasked;
    (c) partially oxidizing the silicon substrate under the unmasked portions of the gate oxide to form field oxide regions on the substrate having a thickness in the range from about 1500 Å to about 3000 Å;
    (d) isotropically removing a portion of the field oxide and gate oxide regions with a hydrofluoric acid solution such that a region of bare silicon is exposed and extends generally horizontally under an edge of the mask and between the field oxide and gate oxide;
    (e) depositing a layer of silicon nitride over the exposed portion of said substrate and the field oxide and mask formed thereon said layer having a thickness in the range from about 700 Å to about 1200 Å;
    (f) anisotropically etching the layer of silicon nitride such that the silicon nitride is removed from the field oxide and such that a silicon nitride spacer is retained in the region previously occupied by the exposed, bare silicon; and
    (g) oxidizing the silicon substrate on the partially formed field oxide regions to form field oxide regions on the substrate having a thickness in the range from about 6000 Å to about 7000 Å.

10. A method for reducing encroachment of field oxide into the active area of a semiconductor device as defined in claim 9, wherein the hydrofluoric acid solution has a concentration in the range from about 5% HF to about 20% HF by weight.

11. A method for reducing encroachment of field oxide into the active area of a semiconductor device as defined in claim 9, wherein the layer of silicon nitride is deposited by the process of low pressure chemical vapor deposition.

* * * * *

UNITED STATES PATENT AND TRADEMARK OFFICE
CERTIFICATE OF CORRECTION

PATENT NO. : 5,118,641

DATED : June 2, 1992

INVENTOR(S) : MARTIN C. ROBERTS

It is certified that error appears in the above-identified patent and that said Letters Patent is hereby corrected as shown below:

Column 5, line 44, delete "a"
Column 5, line 53, delete "a"

Signed and Sealed this

Seventh Day of September, 1993

Attest:

BRUCE LEHMAN

Attesting Officer

Commissioner of Patents and Trademarks